(12) United States Patent
Rissing et al.

(10) Patent No.: US 6,861,683 B2
(45) Date of Patent: Mar. 1, 2005

(54) OPTOELECTRONIC COMPONENT USING TWO ENCAPSULATING MATERIALS AND THE METHOD OF MAKING THE SAME

(75) Inventors: Lutz Rissing, Seebruck (DE); Florian Obermayer, Waging am See (DE); Florian Schroll, Seeon (DE)

(73) Assignee: Dr. Johannes Heidenhain GmbH, Traunreut (DE)

( * ) Notice: Subject to any disclaimer, the term of this patent is extended or adjusted under 35 U.S.C. 154(b) by 0 days.

(21) Appl. No.: 10/474,953

(22) PCT Filed: Mar. 30, 2002

(86) PCT No.: PCT/EP02/03564

§ 371 (c)(1),
(2), (4) Date: Oct. 14, 2003

(87) PCT Pub. No.: WO02/084746

PCT Pub. Date: Oct. 24, 2002

(65) Prior Publication Data

US 2004/0150064 A1 Aug. 5, 2004

(30) Foreign Application Priority Data

Apr. 11, 2001 (DE) .......................................... 101 18 231

(51) Int. Cl.$^7$ ............................................. H01L 27/148
(52) U.S. Cl. ........................ 257/225; 257/228; 257/787; 257/788; 257/789; 257/790; 257/791; 257/792; 257/793; 257/794; 257/795; 438/112; 438/124; 438/127
(58) Field of Search ................................ 257/225, 228, 257/787–795; 438/112, 124, 127

(56) References Cited

U.S. PATENT DOCUMENTS 4,940,855 A * 7/1990 Waitl et al. ................ 174/52.5

| | | |
|---|---|---|
| 5,742,098 A | 4/1998 | Brunner |
| 5,962,810 A | 10/1999 | Glenn |
| 6,143,588 A | 11/2000 | Glenn |
| 6,610,563 B1 | 8/2003 | Waitl et al. |
| 2001/0045573 A1 | 11/2001 | Waitl et al. |
| 2003/0173655 A1 | 9/2003 | Rissing et al. |

FOREIGN PATENT DOCUMENTS

| | | |
|---|---|---|
| DE | 197 55 734 | 6/1999 |
| DE | 198 03 936 | 8/1999 |
| DE | 100 23 353 | 11/2001 |
| DE | 100 24 336 | 11/2001 |
| EP | 0 632 508 | 1/1995 |
| EP | 0 732 740 | 9/1996 |
| JP | 58-34681 | 3/1983 |
| JP | 8-241976 | 9/1996 |
| WO | WO 99/13515 | 3/1999 |
| WO | WO 01/24281 | 4/2001 |

OTHER PUBLICATIONS

Patent Abstracts of Japan, vol. 7, No. 115 (E–176), May 19, 1983.

* cited by examiner

Primary Examiner—Fetsum Abraham
(74) Attorney, Agent, or Firm—Kenyon & Kenyon

(57) ABSTRACT

In an optoelectronic component assembly and a method for the production thereof, the optoelectronic component assembly includes an optoelectronic component arranged on a support element, which is surrounded by a closed dam. An encapsulation is arranged in an inner area of the dam, which encapsulates the optoelectronic component and includes two sealing materials. The inner area of the dam may be filled with a first sealing material up to the top edge of the optoelectronic component. The inner area of the dam located above the optoelectronic component is filled with a second transparent sealing material at least in one area of the window.

15 Claims, 2 Drawing Sheets

OPTOELECTRONIC COMPONENT USING TWO ENCAPSULATING MATERIALS AND THE METHOD OF MAKING THE SAME

FIELD OF THE INVENTION

The present invention relates to an optoelectronic component assembly as well as to a method for producing an optoelectronic component assembly.

BACKGROUND INFORMATION

An optoelectronic component assembly is described in Japanese Published Patent Application No. 8-241976. An optoelectronic component, designed as a CCD chip, which is encircled by a concentrically disposed dam, is positioned on a carrier element. The component is connected via bonding wires to conductor lines or circuit traces in the carrier element and, in this manner, is electrically contacted. A potting, sealing or encapsulation material, made up of two transparent encapsulation materials, is placed in the inner region of the dam. Thermally induced stresses can cause cracks in the encapsulation material and, in some instances, damage the bonding wires. It is, therefore, proposed, in a first step, to introduce a first transparent encapsulation material into the inner region of the dam, to thermally cure this material and, in the process, to eliminate any air bubbles from the encapsulation material. In a second process step, a second transparent encapsulation material is subsequently introduced into the inner region of the dam and thermally cured, in turn, in order to remove any air bubbles present in the second encapsulation material. In this manner, it is possible to ensure that neither of the two encapsulation materials contains any more air bubbles. If, at this point, materials having greatly deviating thermal expansion coefficients are used in a component assembly of this kind, the thermal stresses can produce cracks in the bonding wires. The transparent encapsulation materials or epoxy resins ($\alpha$=50–70 ppm/K) used, on the one hand, and the materials used for the carrier element and, respectively, the bonding wires ($\alpha$=15–25 ppm/K), on the other hand, for instance, have distinctly different expansion coefficients.

It is an aspect of the present invention to provide an optoelectronic component assembly, as well as a suitable method for its manufacture, which may ensure that the bonding wires provided for contacting the optoelectronic component are not damaged even when subject to varying temperatures.

SUMMARY

Example embodiments of the optoelectronic component assembly according to the present invention and example embodiments of the method according to the present invention are described below.

In accordance with an example embodiment of the present invention, a first encapsulation material is introduced into the inner region of the dam, the first encapsulation material e.g., reaching up to the top edge of the optoelectronic component. A second, transparent encapsulation material is introduced over this first material, at least in one spatially defined window region. The first encapsulation material may be selected to be different from the second, transparent encapsulation material. A consideration when selecting the first encapsulation material is, in particular, that it have a lowest possible thermal expansion coefficient, which is approximately adapted to the thermal expansion coefficient of the bonding wires and of the carrier element used. In this manner, thermally induced stresses in the region of the bonding wires and, thus, an undesired cracking or tearing of the same may be avoided.

In addition, when selecting the first encapsulation material, it may be provided to select a material which has a roughest possible surface in the cured state. This may provide a good adhesion to the second encapsulation material placed above it, which additionally may ensure that no thermally produced shearing results between the two encapsulation materials which may potentially damage the bonding wires. In addition, when selecting the first encapsulation material, it may no longer be necessary to consider its optical properties, i.e., the material selection may take place solely on the basis of the optimization criteria indicated above.

An aspect of the technical production process is derived in an example embodiment of the method according to the present invention when the first encapsulation material and the dam material are made of essentially the same base material and merely have different viscosities, since the first encapsulation material and the dam may then be applied and cured in the same work step.

Other aspects of the present invention, as well as details pertaining thereto are derived from the following description of exemplary embodiments, on the basis of the attached figures.

DETAILED DESCRIPTION

Figure 1:
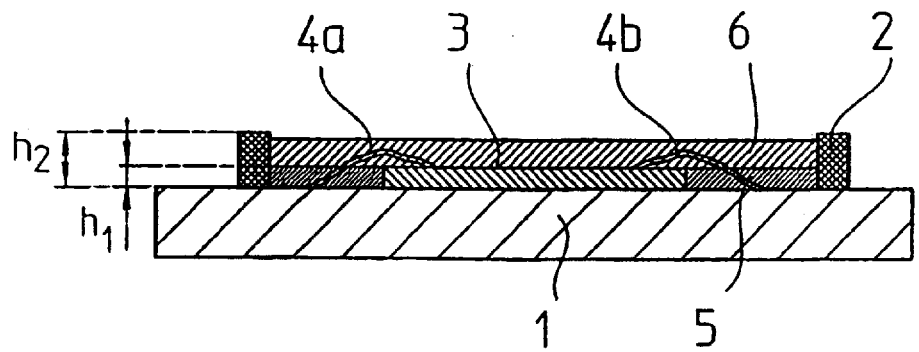
FIG. 1 is a schematized, sectional view of an exemplary embodiment of the optoelectronic component assembly according to the present invention.

In schematized form, FIG. 1 illustrates a lateral sectional view of an example embodiment of the optoelectronic component assembly according to the present invention. Positioned on a carrier element 1 in this case are the other components of the component assembly, which will be discussed in detail in the following. In this example, carrier element 1 may be arranged as a conventional circuit board of FR4 material. Alternatively thereto, other materials come under consideration for carrier element 1, such as FR5, aluminum oxide, glass, etc. Not discernible in FIG. 1 are the conductor lines extending in carrier element 1 that are used for electrically contacting optoelectronic component 3 positioned on carrier element 1 and any other components that are present. In the illustrated exemplary embodiment, as an optoelectronic component 3, an unhoused component 3 in the form of a photodetector is provided, whose radiation-sensitive surface is oriented away from carrier element 1. Alternatively hereto, a corresponding unhoused light source, a so-called Opto-ASIC or some other optoelectronic element may also be used as an optoelectronic component 3.

The particular optoelectronic component 3 is connected via bonding wires 4a, 4b to the electrical conductor lines in carrier element 1, e.g., electrically contacted in a conventional manner via bonding wires 4a, 4b. In the present example, gold is used as the material for bonding wires 4a, 4b. Also usable as bonding wire materials are gold alloys, aluminum, aluminum alloys, copper, etc.

In the illustrated exemplary embodiment, optoelectronic component 3 is adhesively mounted on carrier element 1. This bond may alternatively be produced by alloying, eutectic bonding, anodized bonding, soldering, welding, etc.

In addition, the optoelectronic component assembly according to an example embodiment of the present invention includes a dam 2 which is positioned on carrier element 1 and encircles or surrounds component 3 in a closed form. Dam 2 may have the most widely varied peripheral geometries. For example, it may surround component 3 in a quadratic form. Alternatively, however, a rectangular, polygonal, or round dam profile around component 3 may also be provided.

Dam 2 has a height $h_2$, which, in the present example embodiment, is selected to be distinctly greater than height $h_1$ of component 3. Typical values of heights $h_1$, $h_2$ are, for instance, $h_1$=450 μm and $h_2$=800 μm.

A function of dam 2 with respect to the component assembly according to an example embodiment of the present invention is to form the boundary of the surface required for encapsulating or embedding component 3 on carrier substrate 1 using an encapsulation material in the dam inner region. In accordance with an example embodiment of the present invention, for the encapsulation, two encapsulation materials 5, 6 are used, which are explained in greater detail in the following. By embedding the component assembly using the two encapsulation materials 5, 6, component 3, as well as bonding wires 4a, 4b are protected from mechanical influences.

As a suitable dam material, a conventional black epoxy filler substance in the form of a filled epoxy resin may be provided, as sold by the firm Emerson & Cuming under the type designation Amicon 50300 HT. Alternatively, epoxy filler substances of the firm Dexter Hysol may also be used, which are sold under the product identifications FP 4451.

In the present exemplary embodiment, dam 2 is made of one single dam layer, as is apparent in FIG. 1. Alternatively, however, a two- or multi-layer dam construction may also be provided, as described, for example, in German Published Patent Application No. 100 24 336. Another option may be to form dam 2 as an injection-molded part.

The encapsulation material placed in the well-type dam inner region encapsulating optoelectronic component 3 may be composed of two different encapsulation materials 5, 6. In this connection, in the illustrated example embodiment, the dam inner region is filled more or less up to the top edge of optoelectronic component 3 with a first encapsulation material 5. Accordingly, in the illustrated example, the height of first encapsulation material 5 approximately corresponds to height $h_1$ of component 3. As a general principle, the height of first encapsulation material 5 may also be somewhat lower. However, it may be ensured that the dam inner region may be filled at a maximum up to the top edge of optoelectronic component 3 with the first encapsulation material, and, accordingly, that the radiation-sensitive or, as the case may be, radiation-emitting surface of optoelectronic component 3 is also not substantially covered by first encapsulation material 5.

In accordance with an example embodiment of the present invention, first encapsulation material 5 is selected so that its thermal expansion coefficient $\alpha_{VM1}$ is approximately adapted to the thermal expansion coefficient of bonding wires 4a, 4b ($\alpha_{BD}$) and of carrier element 1 ($\alpha_{TE}$). For this, a black epoxy filler substance is used, for example, which has a thermal expansion coefficient of $\alpha_{VM1}$=18–19 ppm/K. Thus, compared to thermal expansion coefficient $\alpha_{BD}$=15 ppm/K of bonding wires 4a, 4b, a very good adaptation may be achieved when gold is used as material for bonding wires 4a, 4b. Also, the other materials already mentioned above for bonding wires 4a, 4b have thermal expansion coefficients within the range of $\alpha_{BD}$=[15 ppm/K–25 ppm/K]. In a similar manner, when FR4 is used as material for carrier element 1, a good adaptation to its thermal expansion coefficient $\alpha_{TE}$= 15 ppm/K is provided. Suitable first encapsulation materials 5 are sold, for example, by the firm Emerson & Cuming or Dexter Hysol under the product description Amicon 50500-1 or FP 4450.

Accordingly, in the example embodiment, first encapsulation material 5 and the material of dam 2 have the same base material and merely have different viscosities. As will be explained further on, from this material selection, certain advantages may result in the course of an example embodiment of the manufacturing method of the present invention.

In addition, first encapsulation material 5 is selected to have a greatest possible surface roughness in the cured state. This may provide for excellent adhesion to the material situated above it, namely second encapsulation material 6. Second encapsulation material 6 is a commercially available transparent encapsulation material, which is arranged in the inner dam region, at least in a window region above optoelectronic component 3, thus, for example, in the radiation-sensitive region of the photo-element. The product sold by the firm Dexter Hysol under product designation Hysol OS 2800 may be suitable for second encapsulation material 6. Alternatively, the encapsulation materials sold by the same firm under product designations Hysol OS 1600, Hysol OS 1900, Hysol OS 2902, Hysol OS 4000 or Hysol OS 4110 may also be suitable for use in this region.

In the example of FIG. 1, second encapsulation material 6 completely fills up the inner dam region above first encapsulation material 5 and optoelectronic component 3. Alternatively, however, as already mentioned, merely one smaller window region may also be filled with the material.

The arrangement and selection of encapsulation materials 5, 6 in accordance with an example embodiment of the present invention may ensure, on the one hand, that the total filling volume in the dam inner region, which must be filled with transparent second encapsulation material 6, is able to be clearly reduced. As explained above, the problems associated with the thermally induced shearing of bonding wires 4a, 4b may arise because of the greatly differing thermal expansion coefficients of transparent encapsulation materials, on the one hand, and of bonding wires 4a, 4b or of carrier element 1, on the other hand. The reduced filling volume may also have a positive effect in that the stresses caused during curing by the shrinking process may be reduced within the component assembly. In addition, the rough surface quality of first encapsulation material 5 may ensure good interlinking with superjacent second encapsulation material 6. As a result, any thermally produced shearing off of two encapsulation materials 5, 6 from one another or cracking of bonding wires 4a, 4b may virtually no longer be possible.

Besides the foregoing example embodiment of an optoelectronic component assembly, there are other possible alternative example embodiments within the scope of the present invention. Another exemplary embodiment is described in the following in conjunction with FIGS. 2a to 2e, on the basis of which an example embodiment of the method according to the present invention is also described.

Figure 2A:
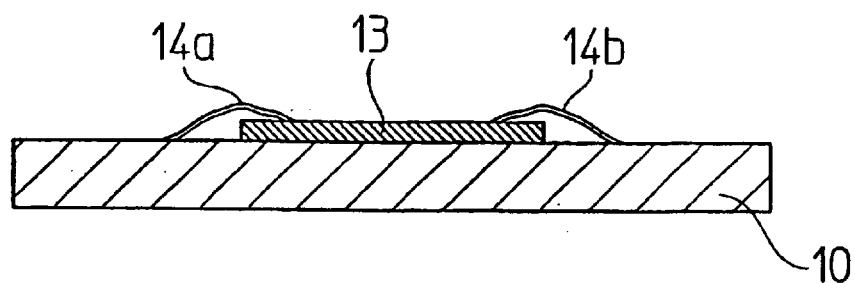
FIGS. 2a to 2e each illustrate a method step within the framework of the method of an example embodiment of the present invention for manufacturing an example embodiment of the optoelectronic component assembly according to the present invention.

In a first process step shown in FIG. 2a, unhoused optoelectronic component 13 in the form of an opto-ASIC is first positioned on carrier element 10 or the circuit board and bonded thereto. In addition, optoelectronic component 13 is electrically contacted, which, in a generally conventional manner, may take place via wire bonding and the placement of corresponding bonding wires 14a, 14b.

Figure 2B:
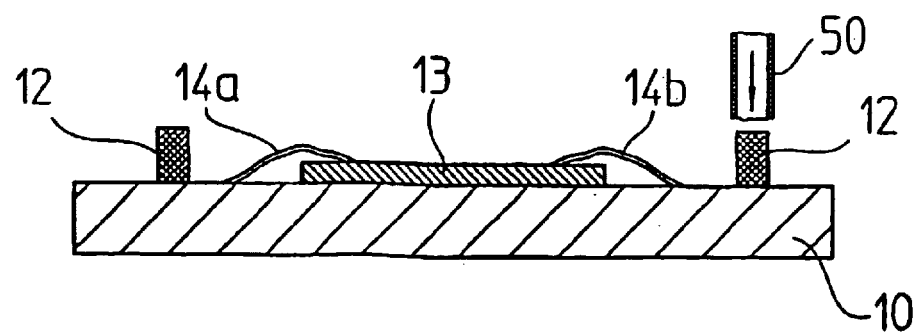

Dam 12 is subsequently placed on carrier element 10 at height $h_2$ and, as described above, completely surrounds optoelectronic component 13. The corresponding process step is illustrated in FIG. 2b. The appropriate dam material is applied in this example embodiment by a schematically indicated dispensing needle 50 using so-called dispensing technology. As already mentioned, alternatively thereto, a dam or frame element arranged as an injection-molded part may also be placed on the carrier element.

In the case of an application using dispensing technology, the desired height $h_2$ of dam 12 is able to be set in a defined manner by adjusting the traversing rate of dispensing needle 50 and the applied quantity of the dam material, etc.

Figure 2C:
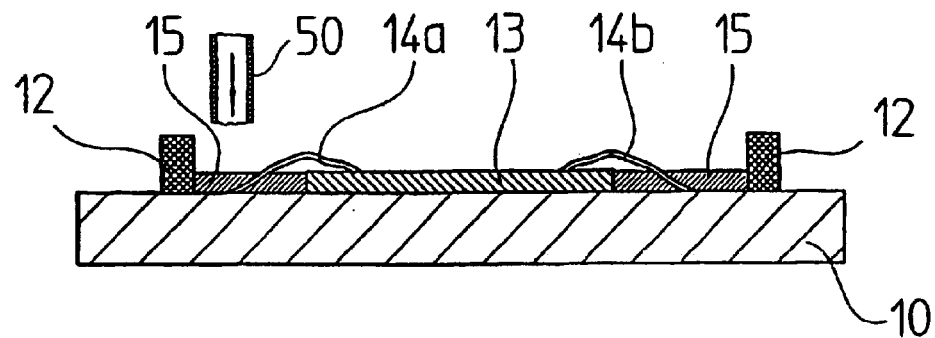

In the subsequent process step illustrated in FIG. 2c, a first encapsulation material 15 is introduced in the dam inner region using dispensing needle 50, e.g., to a maximum height of $h_1$ of the top edge of the component. As explained above, in this exemplary embodiment, a first encapsulation material 15 is selected which is made of the same base material as dam 12. For example, a black filled epoxy resin or an epoxy filler substance may be used for this purpose. Dam 12, as well as first encapsulation material 15 are subsequently cured using a suitable annealing process.

Figure 2D:
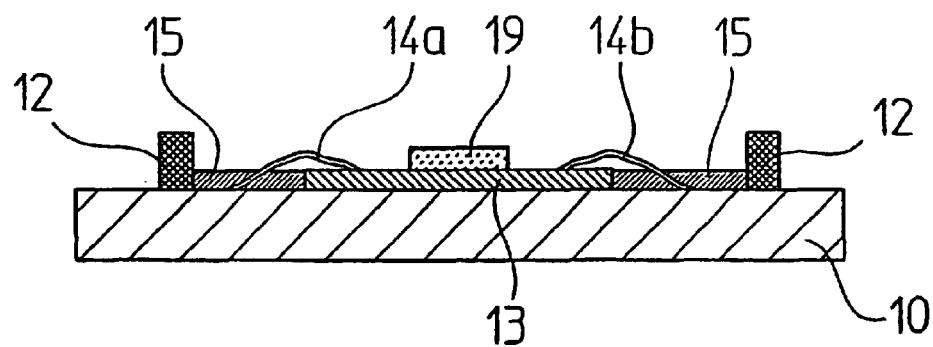

In the following process step shown in FIG. 2d, in contrast to the first described exemplary embodiment, an additional glass plate 19 is placed on the radiation-sensitive surface of component 13 or of the opto-ASIC. This may be accomplished, as indicated in FIG. 2d, before the dam region is filled with the second transparent encapsulation material. Alternatively, however, glass plate 19 may first be pressed onto the surface of component 13 following completion of any residual filling of the dam inner region with the transparent second encapsulation material.

In the case of components 13 having unpassivated active surfaces, the placement of glass plate 19 protects or seals these surfaces. Moreover, by selecting the thickness of glass plate 19 to be large enough, an additional mechanical protection may be ensured for bonding wires 14a, 14b. Alternatively to the described exemplary embodiment, the glass plate may also have a larger thickness and then project slightly out of the second encapsulation material.

Figure 2E:
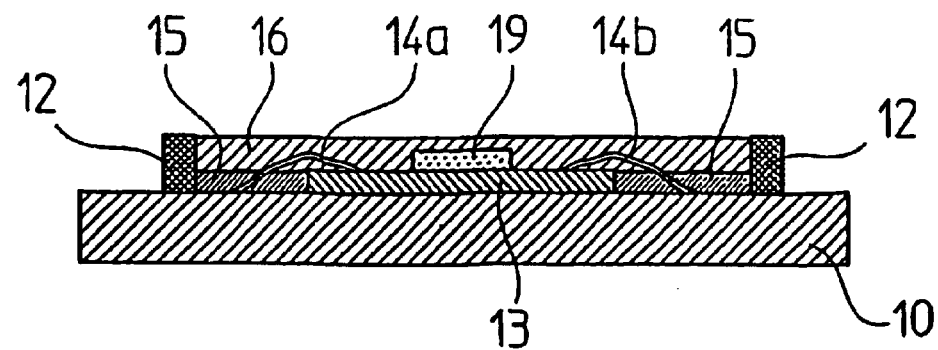

In the next process step illustrated in FIG. 2e, the remaining dam inner region is finally filled with second encapsulation material 16 using dispensing needle 70, more or less up to the top dam edge, for which purpose, as explained above, a transparent encapsulation material is used.

Within the framework of the present invention, there are also alternative variants in addition to the example embodiments.

What is claimed is:

1. An optoelectronic component assembly, comprising:
   a carrier element including conductor lines;
   bonding wires;
   an optoelectronic component arranged on the carrier element and connected via the bonding wires to the conductor lines;
   an enclosed dam arranged on the carrier element and surrounding the optoelectronic component; and
   an encapsulation material arranged in an inner region of the dam and encapsulating the optoelectronic component, the encapsulation material including a first encapsulation material and a transparent second encapsulation material, the inner region of the dam filled to a top edge of the optoelectronic component with the first encapsulation material, the inner region of the dam above the optoelectronic component filled at least in a window region with the second encapsulation material.

2. The optoelectronic component assembly according to claim 1, wherein the first encapsulation material has a thermal expansion coefficient approximately adapted to a thermal expansion coefficient of the bonding wires and to a thermal expansion coefficient of the carrier element.

3. The optoelectronic component assembly according to claim 1, wherein a thermal expansion coefficient of the first encapsulation material is approximately 18 to 19 ppm/K.

4. The optoelectronic component assembly according to claim 1, wherein the first encapsulation material has a substantial surface roughness in a cured state.

5. The optoelectronic component assembly according to claim 1, wherein the first encapsulation material includes a black epoxy filler substance.

6. The optoelectronic component assembly according to claim 1, wherein the first encapsulation material and a material of the dam include a same base material and have different viscosities.

7. The optoelectronic component assembly according to claim 1, wherein the second encapsulation material completely fills up the inner region of the dam above the first encapsulation material and the optoelectronic component.

8. The optoelectronic component assembly according to claim 1, wherein the optoelectronic component includes one of a photo-element and an opto-ASIC having a radiation-sensitive surface oriented away from the carrier element.

9. The optoelectronic component assembly according to claim 8, further comprising a glass plate arranged on the radiation-sensitive surface.

10. A method for manufacturing an optoelectronic component assembly, comprising:
    positioning an optoelectronic component on a carrier element;
    connecting the optoelectronic component electroconductively via bonding wires to conductor tracks in the carrier element;
    arranging an enclosed dam on the carrier element around the optoelectronic component after the positioning step;
    introducing an encapsulation material including two encapsulation materials into an inner region of the dam and encapsulating the optoelectronic component, the introducing step including initially introducing a first non-transparent encapsulation material into the inner region of the dam at a maximum up to a top edge of the optoelectronic component and subsequently filling, at least in a window region, the inner region of the dam above the optoelectronic component with a transparent second encapsulation material.

11. The method according to claim 10, wherein the first encapsulation material has a thermal expansion coefficient approximately adapted to a thermal expansion coefficient of the bonding wires and to a thermal expansion coefficient of the carrier element.

12. The method according to claim 10, wherein a thermal expansion coefficient of the first encapsulation material is approximately 18 to 19 ppm/K.

13. The method according to claim 10, wherein the first encapsulation material is configured to have a substantial surface roughness in a cured state.

14. The method according to claim 10, wherein the first encapsulation material includes a black epoxy filler substance.

15. The method according to claim 10, wherein the second encapsulation material is introduced in the introducing step into a complete inner region of the dam above the first encapsulation material.

* * * * *